(12) United States Patent  
Elmala

(10) Patent No.: US 7,929,923 B2  
(45) Date of Patent: Apr. 19, 2011

(54) WIDE DYNAMIC RANGE OUT-PHASING ARRAY TRANSMITTER

(75) Inventor: Mostafa Elmala, Tigard, OR (US)

(73) Assignee: Intel Corporation, Santa Clara, CA (US)

( * ) Notice: Subject to any disclaimer, the term of this patent is extended or adjusted under 35 U.S.C. 154(b) by 669 days.

(21) Appl. No.: 11/968,816

(22) Filed: Jan. 3, 2008

(65) Prior Publication Data

US 2009/0176462 A1    Jul. 9, 2009

(51) Int. Cl.
*H04B 7/02*    (2006.01)

(52) U.S. Cl. ........ 455/101; 455/102; 455/103; 455/121; 330/126; 330/124 R

(58) Field of Classification Search .................. 455/101, 455/102, 103, 121; 330/126, 124 R
See application file for complete search history.

(56) References Cited

U.S. PATENT DOCUMENTS

| 5,264,807 A * | 11/1993 | Okubo et al. ................. 330/295 |
| 6,889,034 B1 * | 5/2005 | Dent .............................. 455/102 |
| 7,260,157 B2 * | 8/2007 | Hagh et al. .................... 375/297 |
| 2009/0102554 A1 * | 4/2009 | Lejon ......................... 330/124 R |

* cited by examiner

*Primary Examiner* — Sanh D Phu  
(74) *Attorney, Agent, or Firm* — Carrie A. Boone, P.C.

(57) ABSTRACT

A novel out-phasing-array transmitter system and method are disclosed. The method is based on decomposing the input signal into an array of signals to drive a general, multiple paths out-phasing-array transmitter. This decomposition is less sensitive to the phase difference between the multiple paths, and extends the dynamic range of the out-phasing-array transmitter system. The wide dynamic range and the multiple transmission paths increase the maximum achievable output power, in accordance with the WiMAX specifications.

8 Claims, 6 Drawing Sheets

WIDE DYNAMIC RANGE OUT-PHASING ARRAY TRANSMITTER

TECHNICAL FIELD

This application relates to WiMAX communication and, more particularly, to optimizing transmitter architecture for WiMAX radios.

BACKGROUND

The Institute of Electrical and Electronics Engineers (IEEE) has adopted a set of standards for wireless local area networks (WLANs), known as 802.11, as well a set of standards for wireless metropolitan area networks (WMANs), known as 802.16. Wireless products satisfying the 802.11 and 802.16 standards are currently on the market, for example. The term, WiFi, is used herein to describe equipment satisfying the 802.11 standard. The term, WiMAX, short for worldwide interoperability for microwave access, is used herein to describe equipment satisfying the 802.16 standard.

In wireless transmitter applications, particularly WiMAX, it is desired to achieve high output power combined with high-efficiency to save the power of the portable device. An out-phasing transmitter architecture is based on decomposing the input signal into two constant amplitude signals driving two high-efficiency switching amplifiers. However, the dynamic range of this classical out-phasing architecture is limited by the mapping of the amplitude signal into the phase difference between the two signals driving the amplifiers. This mapping limits the dynamic range to 35 dB for 0° to 89° of phase difference (0° corresponds to maximum power condition and 89° corresponds to −35 dB from maximum power).

FIG. 1 shows a classical out-phasing power amplifier 10 composed of two switching amplifiers 12A, 12B (collectively, switching amplifiers 12), with two quarter-wave transmission lines 14A, 14B, for power combining, and a common load 20, according to the prior art. The equations, which describe how to extract two constant amplitude signals, $S_1(t)$ and $S_2(t)$, to drive the two switching amplifiers 12, are shown at the left side of FIG. 1.

The dynamic range of this classical system is limited by the matching accuracy of the two transmission paths after applying any required calibration. For example, a dynamic range of 35 dB is achieved by generating out-phasing signals between 0° and 89° (note that 0° is the condition of maximum power or in-phase condition). If the dynamic range is to be extended further, any smaller amplitude signal has to be mapped within 89° to 90°, which is extremely difficult to achieve even with calibration, due to the non-idealities of the calibration system itself. Moreover, the matching accuracy is a function of process variations and temperature distribution within the die. All of these factors limit the dynamic range of the output signal to roughly 35 dB, and cause the transmitter to be very sensitive to phase (and gain) mismatches between the two paths. FIG. 2 shows a mapping 30 between the input power and the out-phasing angle (10 dB is the maximum input power condition), according to the prior art.

Thus, there is a continuing need for a WiMAX transmitter architecture that overcomes the shortcomings of the prior art.

BRIEF DESCRIPTION OF THE DRAWINGS

The foregoing aspects and many of the attendant advantages of this document will become more readily appreciated as the same becomes better understood by reference to the following detailed description, when taken in conjunction with the accompanying drawings, wherein like reference numerals refer to like parts throughout the various views, unless otherwise specified.

DETAILED DESCRIPTION

In accordance with the embodiments described herein, a novel out-phasing-array transmitter system and method are disclosed. The method is based on decomposing the input signal into an array of signals to drive a general, multiple paths out-phasing-array transmitter. This decomposition is less sensitive to the phase difference between the multiple paths, and extends the dynamic range of the out-phasing-array transmitter system. In some embodiments, the wide dynamic range and the multiple transmission paths increase the maximum achievable output power, in accordance with the WiMAX specifications.

The out-phasing technique employs a combiner with no isolation between two switching amplifiers. Therefore, the load seen by each amplifier depends on the relative phase of the input signals. When the output power is low, the load is high. Hence, an out-phasing power amplifier (PA) provides better efficiency than traditional power amplifiers at low output power region.

Figure 1:
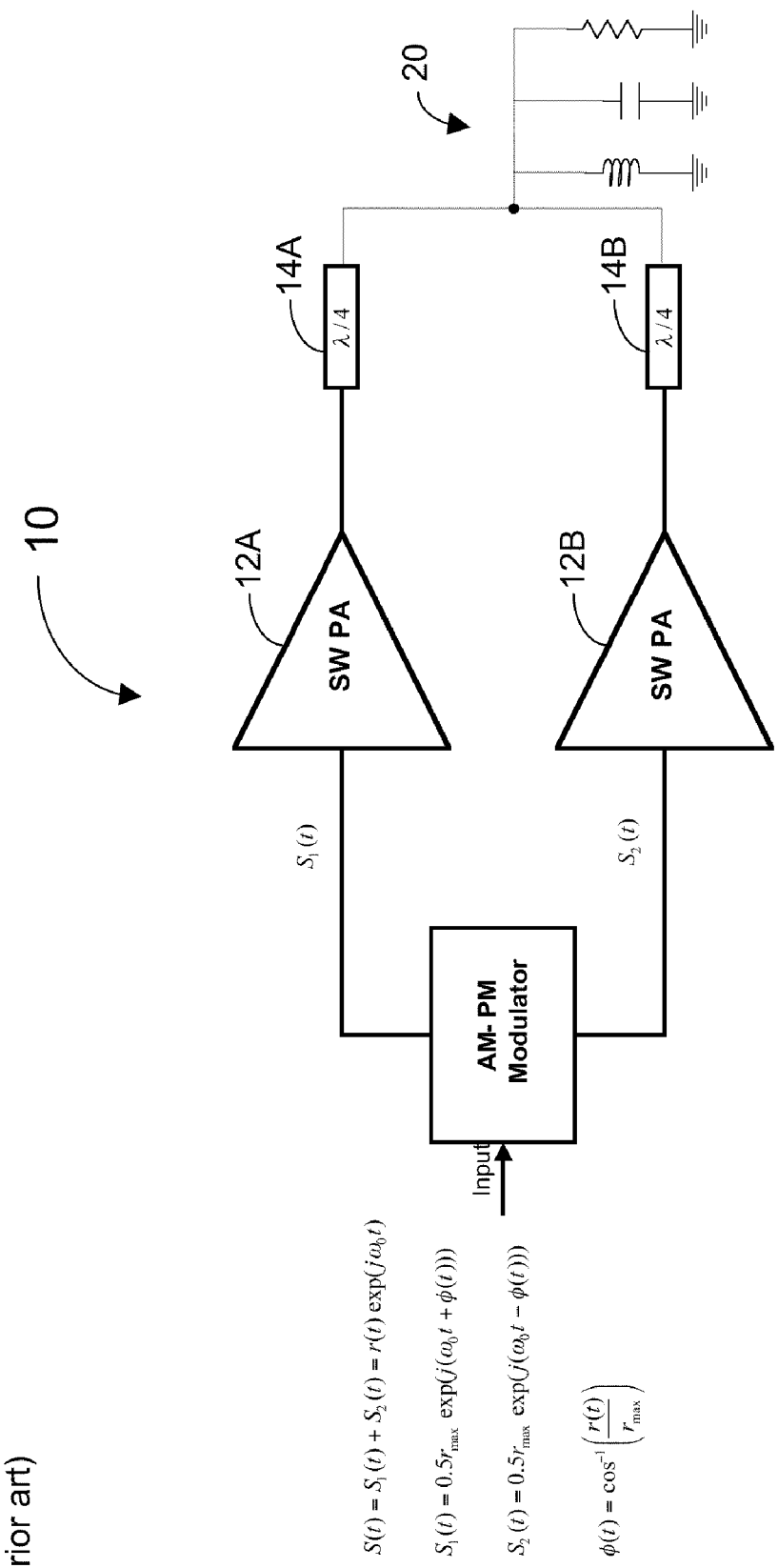
FIG. 1 is a schematic diagram of a classical out-phasing transmitter, according to the prior art.
Figure 2:
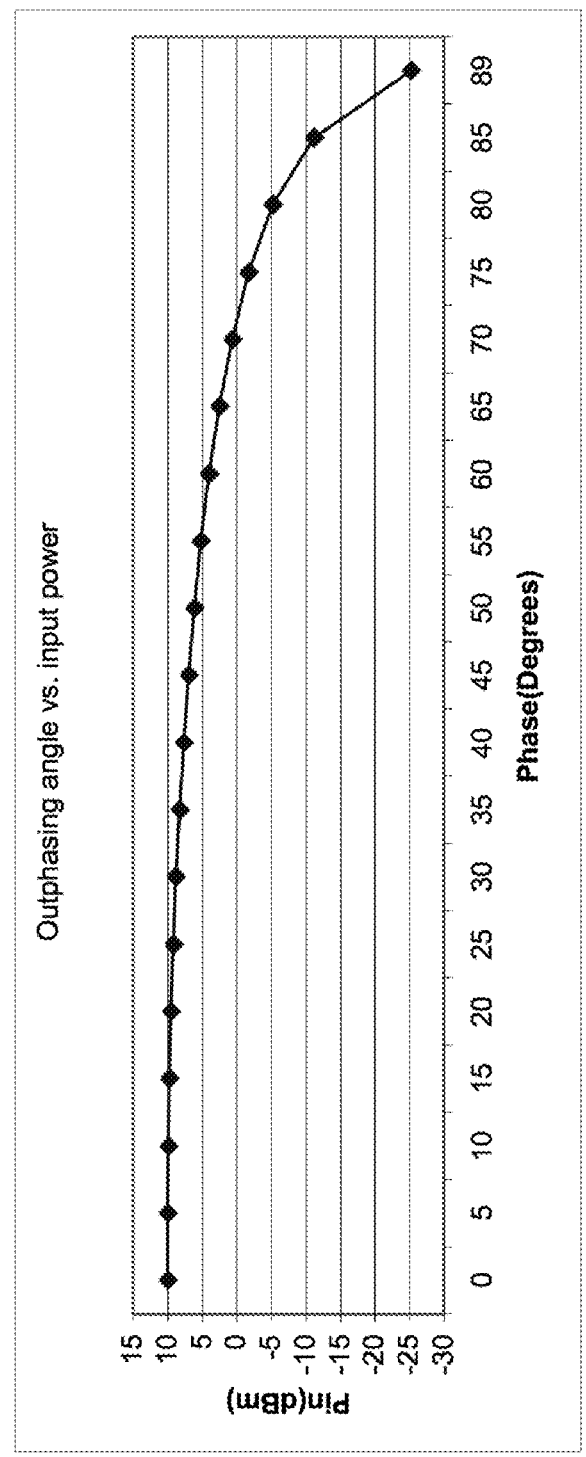
FIG. 2 is a graph showing input power versus out-phasing angle for the classical out-phasing transmitter of FIG. 1, according to the prior art.
Figure 3:
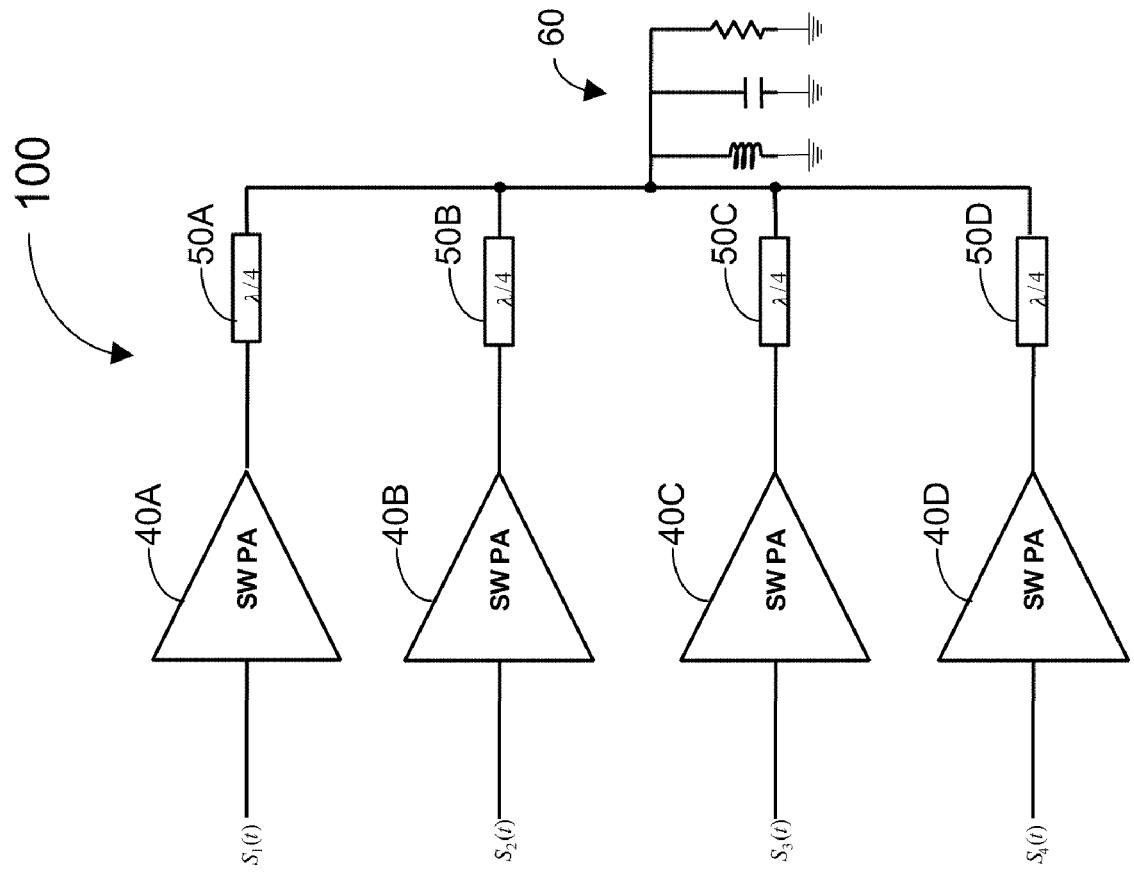
FIG. 3 is a schematic diagram of an out-phasing-array transmitter for n=2, according to some embodiments.

FIG. 3 is a schematic diagram of a novel out-phasing array transmitter architecture 100, according to some embodiments. The out-phasing-array transmitter 100 is based on decomposing the input signal into an array of signals, which are less sensitive to the phase accuracy of the multiple signal paths. In the classical out-phasing system (FIG. 1), the input amplitude r(t) is proportional to $\cos(\phi(t))$, where $\phi(t)$ is the out-phasing signal. So, for very small amplitudes, $\phi(t)$ is very close to 90°, and the dynamic range is limited, as explained above. However, it can be proved that any signal can be decomposed into a summation of $2^n$ constant amplitude signals, where n=1, 2, 3, etc. . . . A special case of this decomposition is the classical out-phasing technique, where n=1.

Before describing the out-phasing-array transmitter 100 in detail, decomposition for the case of n=2 is first proven in the following paragraphs. The same procedure can be generalized to all other n values. For n=2, the signal, S(t), can be written as:

$$S(t) = r(t)\exp(j\omega_0 t) \quad (1)$$

where r(t) is the envelope signal and $j\omega_0 t$ is the carrier frequency.

The phase information can be combined with the variable, $j\omega_0 t$, in equation (1), but is omitted to simplify the analysis. This signal can also be written as a summation of four constant amplitude signals, as:

$$S(t) = \sum_{i=1}^{4} S_i(t) \quad (2)$$

where $$S_1(t) = \frac{1}{4}r_{max}\exp(j(\omega_0 t + \phi_1(t) + \phi_2(t))) \quad (3)$$

$$S_2(t) = \frac{1}{4}r_{max}\exp(j(\omega_0 t + \phi_1(t) - \phi_2(t))) \quad (4)$$

$$S_3(t) = \frac{1}{4}r_{max}\exp(j(\omega_0 t - \phi_1(t) + \phi_2(t))) \quad (5)$$

$$S_4(t) = \frac{1}{4}r_{max}\exp(j(\omega_0 t - \phi_1(t) - \phi_2(t))) \quad (6)$$

The equations (3), (4), (5), and (6) may be rewritten as follows:

$$S(t) = \frac{1}{2}r_{max}\exp(j(\omega_0 t + \phi_1(t)))\cos(\phi_2(t)) + \frac{1}{2}r_{max}\exp(j(\omega_0 t - \phi_1(t)))\cos(\phi_2(t))$$

This equation may be restated as:

$$S(t) = r_{max}\cos(\phi_1(t))\cos(\phi_2(t))\exp(j\omega_0 t) \quad (7)$$

And, equation (7) may be restated as:

$$r(t) = r_{max}\cos(\phi_1(t))\cos(\phi_2(t)) \quad (8)$$

Equation (8) is the amplitude mapping equation for the case where n=2.

From the above equations, the following general decomposition equations result:

$$r(t) = r_{max}\cos(\phi_1(t)) \quad (9)$$

Equation (9) is for the classical out-phasing case, with n=1. Similarly, decomposition equations may be derived for n=2, n=3, and so on, until, in the general case, n=N, the following equation results:

$$r(t) = r_{max}\cos(\phi_1(t))\cos(\phi_2(t))\ldots\cos(\phi_N(t)) \quad (10)$$

Similarly, the constant amplitude signal, S(t), may be derived for any value, n. For n=1, the classical out-phasing case, S(t) is:

$$S(t) = \sum_{i=1}^{2} S_i(t) \quad (11)$$

Equation (11) may be derived for n=2, n=3, and so on, until, in the general case, n=N, the following equation results:

$$S(t) = \sum_{i=1}^{2^N} S_i(t) \quad (12)$$

For the classical out-phasing case (n=1), the following two equations result:

$$\left.\begin{aligned} S_1(t) &= \frac{1}{2}r_{max}\exp(j(\omega_0 t + \phi_1(t))) \\ S_2(t) &= \frac{1}{2}r_{max}\exp(j(\omega_0 t - \phi_1(t))) \end{aligned}\right\} \quad (13)$$

Equation (13) may be generalized for n=N, resulting in the following equations:

$$\left.\begin{aligned} S_1(t) &= \frac{1}{2^N}r_{max}\exp(j(\omega_0 t + \phi_1(t) + \phi_2(t) + \ldots + \phi_N(t))) \\ S_2(t) &= \frac{1}{2^N}r_{max}\exp(j(\omega_0 t + \phi_1(t) + \phi_2(t) + \ldots - \phi_N(t))) \\ &\quad\ldots \\ &\quad\ldots \\ S_{2^N}(t) &= \frac{1}{2^N}r_{max}\exp(j(\omega_0 t - \phi_1(t) - \phi_2(t) - \ldots - \phi_N(t))) \end{aligned}\right\} \quad (14)$$

The benefit of this general decomposition appears when calculating the required phases to generate small signals, i.e. to extend the dynamic range and reduce sensitivity of the mapping between amplitude and phases.

Tables 1-4 demonstrate the required phases for mapping the input power, $P_{in}$, into out-phasing signals for the cases of n=1, 2, 3, and 4, respectively. Input power, $P_{in}$, is given in dBm while the phases are given in degrees.

TABLE 1

Out-phasing signal for n = 1 as a function of $P_{in}$.

| $P_{in}$ (dBm) | $\phi_1$ (in degrees) |
|---|---|
| 10 | 0 |
| 5 | 55.78 |
| 0 | 71.57 |
| −5 | 79.76 |
| −10 | 84.26 |
| −15 | 86.78 |
| −20 | 88.19 |
| −25 | 88.98 |
| −30 | 89.43 |
| −35 | 89.68 |
| −40 | 89.82 |
| −45 | 89.90 |
| −50 | 89.94 |

For n=2-4, the choice of out-phasing signals is not unique. However, in some embodiments, the out-phasing array transmitter architecture 100 is based on reducing the sensitivity of the chosen out-phasing signals. In some embodiments, these values will be stored as a look-up table and will be modified by whatever required pre-distortion algorithm for the designed transmitter system.

TABLE 2

Out-phasing signals for n = 2 as a function of $P_{in}$

| $P_{in}$ (dBm) | $\phi_1$ (in degrees) | $\phi_2$ (in degrees) |
|---|---|---|
| 10 | 0 | 0 |
| 5 | 55.78 | 0 |
| 0 | 71.57 | 0 |
| −5 | 79.76 | 0 |
| −10 | 84.26 | 0 |
| −15 | 85.52 | 44 |
| −20 | 25.03 | 88 |
| −25 | 59.37 | 88 |
| −30 | 73.35 | 88 |

TABLE 2-continued

Out-phasing signals for n = 2 as a function of $P_{in}$

| $P_{in}$ (dBm) | $\phi_1$ (in degrees) | $\phi_2$ (in degrees) |
|---|---|---|
| −35 | 80.73 | 88 |
| −40 | 84.80 | 88 |
| −45 | 87.08 | 88 |
| −50 | 88.36 | 88 |

In Table 2, for $P_{in}$ from 10 dBm to −10 dBm, since the second out-phasing angle, $\phi_2$, is zero, the first out-phasing angle, $\phi_1$, has the same values as in Table 1. At $P_{in}$ of −15 dBm, the second out-phasing angle, $\phi_2$, is set to 44 degrees and the first out-phasing angle, $\phi_1$, is less than in Table 1 (85.52 versus 86.78). At $P_{in}$ of −20 dBm, the first out-phase angle, $\phi_1$, is lower, at 25.03 degrees.

TABLE 3

Out-phasing signals for n = 3 as a function of $P_{in}$

| $P_{in}$ | $\phi_1$ | $\phi_2$ | $\phi_3$ |
|---|---|---|---|
| 10 | 0 | 0 | 0 |
| 5 | 55.78 | 0 | 0 |
| 0 | 71.57 | 0 | 0 |
| −5 | 79.76 | 0 | 0 |
| −10 | 84.26 | 0 | 0 |
| −15 | 85.52 | 44 | 0 |
| −20 | 25.03 | 88 | 0 |
| −25 | 59.37 | 88 | 0 |
| −30 | 73.35 | 88 | 0 |
| −35 | 80.73 | 88 | 0 |
| −40 | 84.80 | 88 | 0 |
| −45 | 87.08 | 88 | 0 |
| −50 | 34.81 | 88 | 88 |
| −55 | 62.50 | 88 | 88 |
| −60 | 74.95 | 88 | 88 |
| −65 | 81.60 | 88 | 88 |
| −70 | 85.29 | 88 | 88 |

In Table 3, for $P_{in}$ from 10 dBm to −10 dBm, since the second out-phasing angles, $\phi_2$ and $\phi_3$, are zero, the first out-phasing angle, $\phi_1$, has the same values as in Table 1. At $P_{in}$ of −15 dBm to −45 dBm, since the third out-phasing angle, $\phi_3$, is zero, the first and second out-phasing angles, $\phi_1$ and $\phi_2$, are the same as in Table 2. At $P_{in}$ of −50 dBm, the second and third out-phasing angles, $\phi_2$ and $\phi_3$, are set to 88 degrees and the first out-phasing angle, $\phi_1$, drops. Out-phase angles are obtainable at lower and lower power levels (−55 to −70 dBm), relative to the power levels of Tables 1 and 2.

TABLE 4

Out-phasing signals for n = 4 as a function of $P_{in}$

| $P_{in}$ | $\phi_1$ | $\phi_2$ | $\phi_3$ | $\phi_4$ |
|---|---|---|---|---|
| 10 | 0 | 0 | 0 | 0 |
| 5 | 55.78 | 0 | 0 | 0 |
| 0 | 71.57 | 0 | 0 | 0 |
| −5 | 79.76 | 0 | 0 | 0 |
| −10 | 84.26 | 0 | 0 | 0 |
| −15 | 85.52 | 44 | 0 | 0 |
| −20 | 25.03 | 88 | 0 | 0 |
| −25 | 59.37 | 88 | 0 | 0 |
| −30 | 73.35 | 88 | 0 | 0 |
| −35 | 80.73 | 88 | 0 | 0 |
| −40 | 84.80 | 88 | 0 | 0 |
| −45 | 85.94 | 88 | 44 | 0 |
| −50 | 34.81 | 88 | 88 | 0 |
| −55 | 62.50 | 88 | 88 | 0 |
| −60 | 74.95 | 88 | 88 | 0 |
| −65 | 81.60 | 88 | 88 | 0 |
| −70 | 85.29 | 88 | 88 | 0 |
| −75 | 86.32 | 88 | 88 | 44 |
| −80 | 41.93 | 88 | 88 | 88 |
| −85 | 65.29 | 88 | 88 | 88 |
| −90 | 76.39 | 88 | 88 | 88 |

In Table 4, out-phase angles are obtainable at power levels as low as −90 dBm, even lower than shown in Table 3 (−70 dBm).

If the useful dynamic range is measured by the minimum, $P_{in}$, achievable with out-phasing signals limited to say 88°, then the dynamic ranges (in dB) are 30, 60, 85, and 110, for the cases of n=1, 2, 3, and 4, respectively. This clearly shows the extension of the dynamic range for higher out-phasing orders.

Practically speaking, the complexity and switching sources increase with an increase in the value of n, which may limit the actual achievable dynamic range. Moreover, it will be more difficult to achieve balance between different paths with higher orders of out-phasing. In some embodiments, the cases of n=2 and 3 are preferred as a compromise between complexity and achieving the benefits of extending dynamic range. Moreover, the sensitivity of the variation of the out-phasing signals for these cases are much less than for the classical out-phasing system (n=1).

Figure 4:
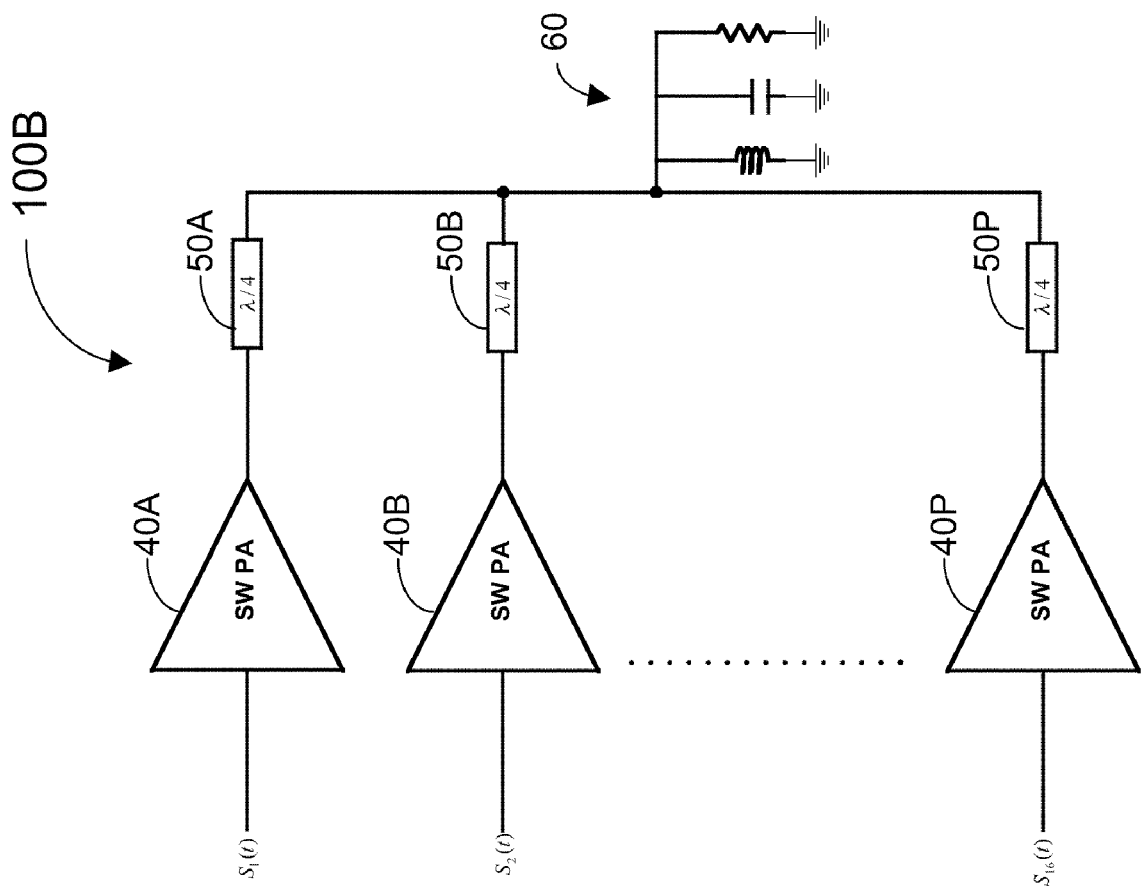
FIG. 4 is a schematic diagram of an out-phasing-array transmitter for n=4, according to some embodiments.
Figure 5:
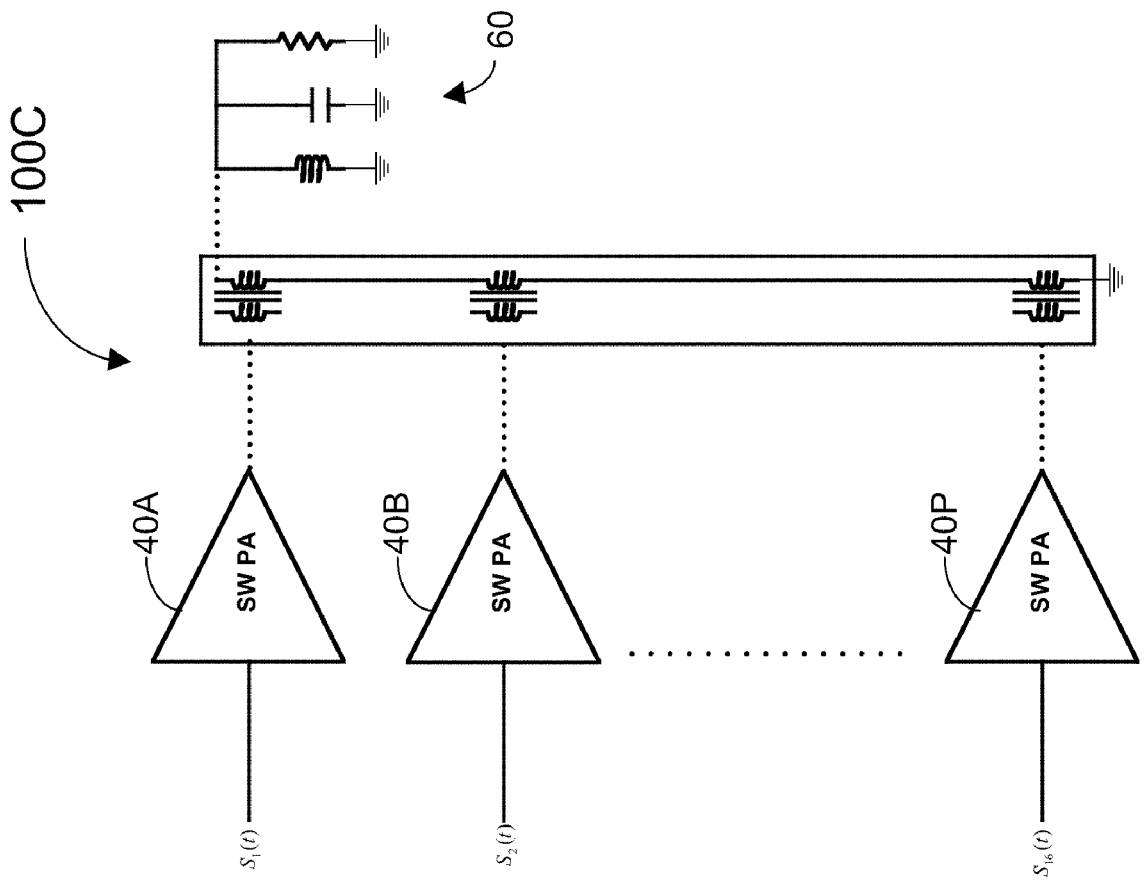
FIG. 5 is a schematic diagram in which the out-phasing array transmitter of FIG. 4 includes a transformer, according to some embodiments.

The out-phasing-array transmitter architecture 100 of FIG. 3, based on the above analysis, is designed for a higher order of out-phasing, particularly the cases of n=2, n=3, and n=4, and uses equations (9)-(14), above, according to some embodiments. The out-phasing-array transmitter architecture 100 is less sensitive to mapping between amplitude and out-phasing signals. Further, the out-phasing-array transmitter 100 maintains a wide dynamic range. FIG. 3 demonstrates this new architecture for the case n=2. The output power combiner is based on using quarter-wave transmission lines to maintain the load-pulling effect, to boost the efficiency of the system. FIG. 4 is the out-phasing-array transmitter 100B for n=4. FIG. 5 is a schematic diagram of a second out-phasing-array transmitter 100C, which demonstrates another compact way for power combining through a distributed transformer.

The out-phasing-array transmitter 100 enables achieving a much wider dynamic range for mapping the amplitude information into out-phasing signal(s) than for prior-art transmitters, in some embodiments. Such an implementation is beneficial, particularly for orthogonal frequency division multiplexing (OFDM) or other signaling techniques with large peak-to-average ratio.

The out-phasing-array transmitter 100 is much less sensitive than the classical out-phasing system, and therefore, it is more robust against gain and phase mismatches between different transmission paths. Further, the out-phasing-array transmitter 100 is much easier to calibrate for non-linearity within the transmitter, such as amplitude modulation-phase modulation (AM-PM) distortion (which is out-phasing-PM distortion in this case).

In FIG. 3, the out-phasing-array transmitter 100 consists of an array of four switching power amplifiers (PA) 40A, 40B, 40C, and 40D (collectively, switching amplifiers 40), with associated quarter-wave transmission lines 50A, 50B, 50C, and 50D, for power combining, and a common load 60. Equations (9)-(14) describe how to extract four constant amplitude signals, $S_1(t)$, $S_2(t)$, $S_3(t)$, and $S_4(t)$, to drive the associated switching amplifiers 40.

In FIG. 4, the n=4 case, the out-phasing-array transmitter 100B consists of an array of sixteen switching power amplifiers (PA) 40A, 40B, ..., 40P (collectively, switching amplifiers 40), with associated quarter-wave transmission lines 50A, 50B, ..., 50P for power combining, and a common load 60. Equations (9)-(14) describe how to extract sixteen constant amplitude signals, $S_1(t)$, $S_2(t)$, ..., $S_{16}(t)$, to drive the associated switching amplifiers 40. The out-phasing-array transmitters 100A, 100B, and 100C may be extended for n=3, n=5, n=6, and so on. Reference to the out-phasing-array transmitter 100, unless otherwise indicated, is intended to include any value of n.

The switching amplifiers 40, together with the load pulling effect of the amplifiers, boosts the efficiency of the out-phasing-array transmitter 100. Moreover, the design enables the out-phasing-array transmitter 100 to be mainly a "digital-style" transmitter, with the known benefits of scalability with process, reconfiguration for multi-mode operation, more die-integration, small die-area, power savings, digital control, less sensitivity to process and temperature, and so on.

Figure 6:
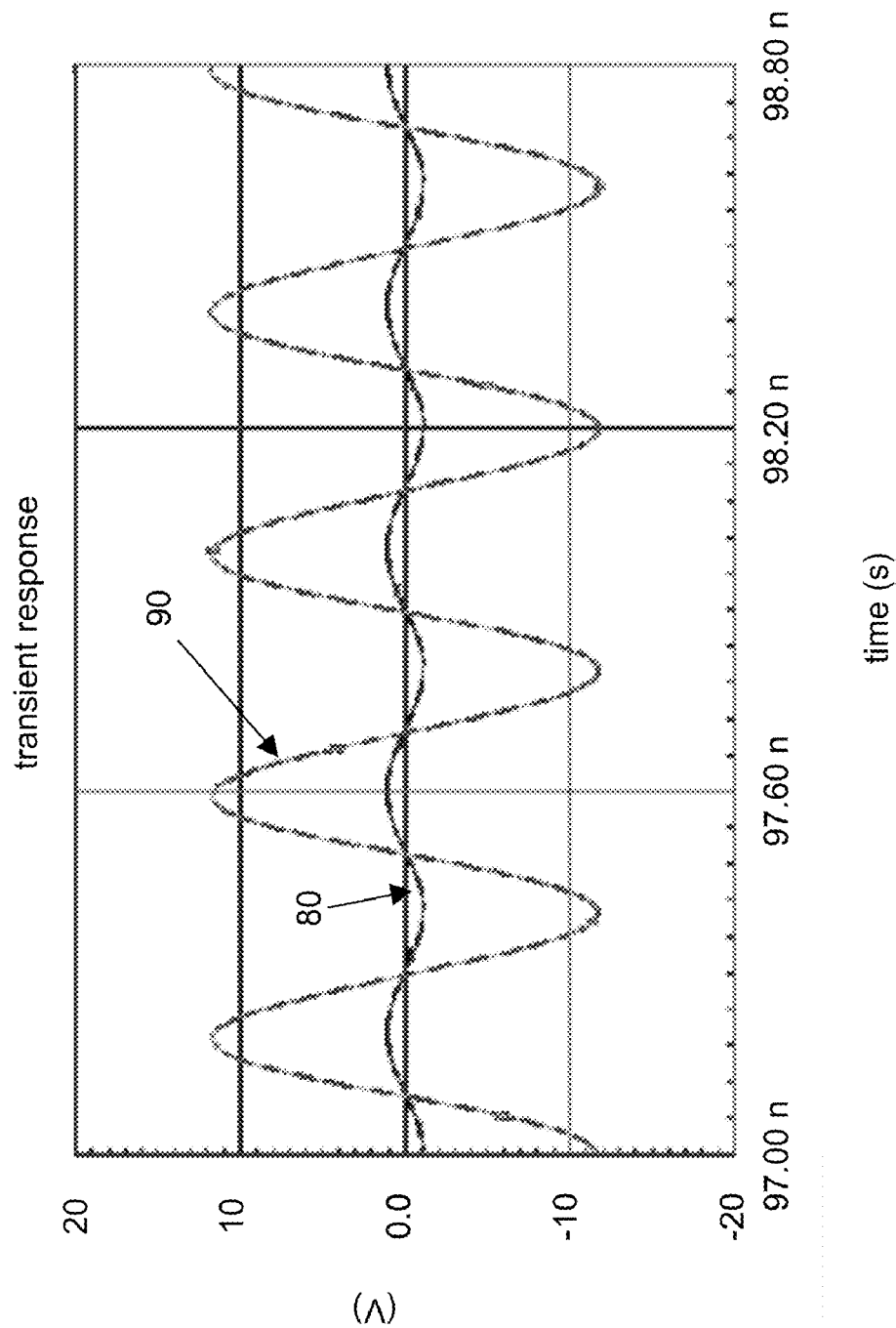
FIG. 6 is a graph showing simulation results for the out-phasing-array transmitter of FIG. 3, according to some embodiments.

FIG. 6 is a graph 110 showing simulation results of two out-phasing cases mapping two amplitudes of 20 dB difference. The wave 90 is the maximum amplitude case, where $\phi_1=0$, $\phi_2=0$, and $V_t$ is $/rf_{out}$. The wave 80 is the case of 20 dB lower signal than the maximum amplitude, where $\phi_1=84.26$, $\phi_2=0$, and $V_t$ is $/rf_{out}$.

The out-phasing-array transmitter 100 facilitates the integration of small complementary metal-oxide semiconductor (CMOS) power amplifier modules into the radio frequency (RF) integrated circuit. In this way, the difficult requirements of achieving maximum power levels in the order of 30 dBm (e.g., in systems like WiMAX) can be achieved in CMOS technology. For the same reason, PA integration in advanced CMOS processes becomes more reliable, as each PA module can use a lower supply voltage, in some embodiments. This can avoid problems of break-down and hot-carrier effects.

The out-phasing-array transmitter 100 is of great benefit to applications such as a WiMAX portable device, where a large transmitter power and low power consumption are preferred. Additionally, the out-phasing-array transmitter 100 may be used in other wireless personal area network (PAN), local area network (LAN), metropolitan area network (MAN), and wireless area network (WAN) environments.

In some embodiments, the out-phasing-array transmitter 100 may be completely integrated in CMOS, minimizing cost. The out-phasing-array transmitter 100 may be implemented in a WiMAX system occupying a small die area with multiple PA/pre-driver ports. In some embodiments, the out-phasing-array transmitter 100 is implemented on a low-voltage high-speed digital process.

While the application has been described with respect to a limited number of embodiments, those skilled in the art will appreciate numerous modifications and variations therefrom. It is intended that the appended claims cover all such modifications and variations as fall within the true spirit and scope of the above description.

I claim:

1. An out-phasing-array transmitter, comprising:
    $2^N$ switching power amplifiers to receive a signal, S(t), the signal being a summation of $2^N$ constant amplitude signals, $S_1(t)$, $S_2(t)$, ..., $S_{2^N}(t)$, for integer N, where the constant amplitude signals are defined by the following equations:

$$S_1(t) = \frac{1}{2^N} r_{max} \exp(j(\omega_0 t + \phi_1(t) + \phi_2(t) + \ldots + \phi_N(t)))$$
$$S_2(t) = \frac{1}{2^N} r_{max} \exp(j(\omega_0 t + \phi_1(t) + \phi_2(t) + \ldots - \phi_N(t)))$$
$$\ldots$$
$$S_{2^N}(t) = \frac{1}{2^N} r_{max} \exp(j(\omega_0 t - \phi_1(t) - \phi_2(t) - \ldots - \phi_N(t)))$$

where $r_{max}$ is a peak value of an envelope signal, $j\omega_0 t$ is a carrier frequency, and $\phi_1(t), \phi_2(t), \ldots, \phi_N(t)$ are out-phasing angles; and a table comprising values in degrees to be plugged into the out-phasing angles of the equations for a given input power;

wherein a dynamic range greater than 35 dBm is achieved.

2. The out-phasing-array transmitter of claim 1, further comprising:
    $2^N$ quarter-wave transmission lines coupled to outputs of the $2^N$ switching power amplifiers, the transmission lines joining together;

wherein the constant amplitude signals are rejoined as the signal once leaving the power amplifiers.

3. The out-phasing-array transmitter of claim 2, further comprising:
    a load, wherein the signal is received into the load.

4. The out-phasing-array transmitter of claim 1, wherein N=2 and the dynamic range is close to 60 dBm.

5. The out-phasing-array transmitter of claim 1, wherein N=3 and the dynamic range is close to 85 dBm.

6. The out-phasing-array transmitter of claim 1, wherein N=4 and the dynamic range is close to 110 dBm.

7. An out-phasing-array transmitter, comprising:
    a first switching power amplifier to receive a signal, $S_1(t)$, the signal being defined according to an equation, $$S_1(t) = \frac{1}{4} r_{max} \exp(j(\omega_0 t + \phi_1(t) + \phi_2(t))),$$

wherein $r_{max}$ is a peak value of an envelope signal, $j\omega_0 t$ is a carrier frequency, $\phi_1(t)$ is a first out-phasing angle, and $\phi_2(t)$ is a second out-phasing angle;

a second switching power amplifier to receive a signal, $S_2(t)$, the signal being defined according to an equation, $$S_2(t) = \frac{1}{4} r_{max} \exp(j(\omega_0 t + \phi_1(t) - \phi_2(t)));$$

a third switching power amplifier to receive a signal, $S_3(t)$, the signal being defined according to an equation, $$S_3(t) = \frac{1}{4} r_{max} \exp(j(\omega_0 t - \phi_1(t) + \phi_2(t)));$$

a fourth switching power amplifier to receive a signal, $S_4(t)$, the signal being defined according to an equation, $$S_4(t) = \frac{1}{4} r_{max} \exp(j(\omega_0 t - \phi_1(t) + \phi_2(t)));$$

and a table comprising values in degrees for the first and second out-phasing angles, $\phi_1(t)$ and $\phi_2(t)$ for a given input power;

wherein a dynamic range of up to 60 dBm is achieved.

8. The out-phasing array transmitter of claim 7, wherein the first out-phasing angle, $\phi_1(t)$, is 88.36 degrees and the second out-phasing angle, $\phi_2(t)$, is 88 degrees when the input power is −50 dBm.

* * * * *